United States Patent [19]

Brown

[11] 3,873,429

[45] Mar. 25, 1975

[54] FLUSH PRINTED CIRCUIT APPARATUS

[75] Inventor: Elvin E. Brown, Cedar Rapids, Iowa

[73] Assignee: Rockwell International Corporation, Dallas, Tex.

[22] Filed: July 9, 1973

[21] Appl. No.: 377,884

[52] U.S. Cl. .................... 204/15, 29/625, 174/68.5

[51] Int. Cl. ............................................ C23b 5/48

[58] Field of Search ........ 204/15; 174/68.5; 29/625, 29/527.2, 527.4

[56] References Cited

UNITED STATES PATENTS

| | | | |
|---|---|---|---|
| 2,716,268 | 8/1955 | Steigerwalt | 29/625 |
| 2,958,120 | 11/1960 | Taylor | 29/625 |
| 3,208,921 | 9/1965 | Hill | 204/15 |
| 3,296,099 | 1/1967 | Dinella | 204/15 |
| 3,475,284 | 10/1969 | Olson | 204/15 |
| 3,702,284 | 11/1972 | Merkenschlager | 117/212 |

*Primary Examiner*—T. M. Tufariello
*Attorney, Agent, or Firm*—Bruce C. Lutz

[57] ABSTRACT

A process for producing flush printed circuits with plated through holes comprising etching the circuit paths, flushing the circuit paths with the surface of the material, drilling the holes and producing plating material in the hole area through and subsequent to the use of electroless flash material and then removing the flash from all areas other than the hole portion of the circuit board.

2 Claims, 12 Drawing Figures

FLUSH PRINTED CIRCUIT APPARATUS

The present invention is generally concerned with printed circuit boards and more specifically with a method of making a flush printed circuit board having plated through holes.

The prior art method of making flush printed circuit boards with plated through holes was to make the printed circuit board in the normal fashion and fill in the voids or low areas between the circuit paths with a resin. Normally some of the resin would rise higher than and cover at least some of the circuit paths so that the resin then needed to be sanded smooth with the surface of the circuit paths. This involved very careful attention to the depth of sanding and often resulted in destruction of the circuit paths at one point or another thereby causing rejection of the boards.

The present invention on the other hand uses a double cladded flushing type printed circuit board material which is only partially cured. After the formation of the circuit paths, this board material is subjected to high pressures and temperatures to cure the board and produce a surface which is flush across the board. The glass fibers, which form a structural base for the epoxy resin of the board, are distorted, from the normal parallel configuration, to accommodate the printed circuit conductor material. While the use of flushing grade printed circuit material has been used in the prior art to produce printed circuit boards, no one has previously successfully made plated through holes because there is no conductive path from the circuitry on one side of the board to the circuitry on the other. As will be realized, if the plated through holes are produced before the flushing process, there will be a compressing of the material in the hole area and often times this results in a jamming of the hole by the deformation of the cylindrical printed circuit conductive material in the hole upon being subjected to pressure and compressed to a shorter total length.

Accordingly, it is an object of the present invention to produce an improved printed circuit board having plated through holes.

Other objects and advantages of the present invention will be apparent from a reading of the specification and appended claims in conjunction with the drawings wherein:

FIG. 8 illustrates the board of FIG. 7 after exposure and developing of the photo resist material as applied in FIG. 7 around the holes to be plated through;

DETAILED DESCRIPTION

Figure 1:
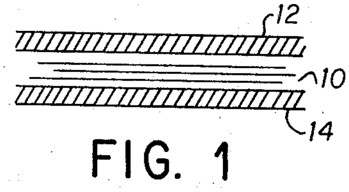
FIG. 1 is an illustration of a fiber glass reinforced epoxy impregnated flushing type material board as received with conductive copper cladding on both sides of the board.

In FIG. 1 an epoxy impregnated glass fiber printed circuit board 10 is shown with plated copper 12 and 14 attached to each side. This printed circuit board is designated as flushing material type printed circuit board as it is only partially cured as received with the printed circuit material contained thereon. After some of the processes are performed, this material is subjected to high pressure and a high curing temperature to obtain the board which is the end result of this process.

Figure 2:
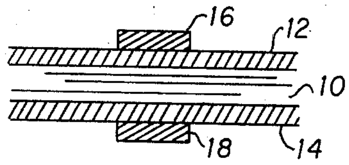
FIG. 2 illustrates the board of FIG. 1 with developed photo resist defining the printed circuit paths.

In FIG. 2 and the remaining figures the same designating numbers will be used for the same materials in an attempt to eliminate confusion and reduce the number of designators.

In FIG. 2 a resist material has been applied to the board of FIG. 1 and exposed and the unexposed resist has been developed away to leave a portion of resist material 16 on one side of the board and a portion 18 on the other side in the hole pad area. This resist material 16 and 18 is used in the process to be described to cover given circuitry, hole pads and future holes on the printed circuit board. While the descriptive process will show only a single hole or hole pad, it is to be realized in actual use this hole pad would be connected by circuit paths on one or both sides of the board to other hole pads and terminating strips.

Figure 3:
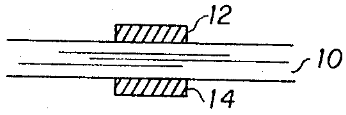
FIG. 3 illustrates the board of FIG. 2 after the photo resist has been removed and the circuit paths remain.
Figure 4:
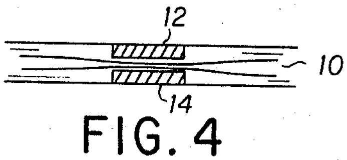
FIG. 4 illustrates the board of FIG. 3 after the pressure and temperature are applied to flush the surfaces of the board.

In FIG. 3 the board has been etched and the resist removed to leave only the copper portion 12 and 14 at the site of the hole in the board. In FIG. 4 the board has been subjected to pressures, depending on desired results ranging from 200 to 1,000 psi. This pressure is combined with a high temperature to cure the board which, depending time in the press, will range from 300°to 380°F. This pressure recesses the copper conductors illustrated by 12 and 14 into the board 10 until they are flush with the surface of the dielectric. As may be seen from the previous and present figures, the board before being pressed has substantially horizontal reinforcing fibers. After the pressing, as shown in FIG. 4, the fibers are distorted and are packed substantially closer together between the recessed copper. As will be realized, however, these copper strips are greatly magnified in relation to the width of the board for purposes of illustration and the distortion of the reinforcing fibers may not be as severe as illustrated.

Figure 5:
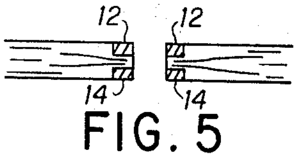
FIG. 5 illustrates the board of FIG. 4 after a hole is drilled.

In FIG. 5 a hole has been drilled from one side of the board to the other.

Figure 6:
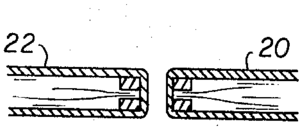
FIG. 6 illustrates the board of FIG. 5 after an electroless copper flashing is applied.

In FIG. 6 a very thin layer of electroless plated copper flash is applied to the entire board and it attaches itself to the board and to the sides of the holes in the board. This electroless copper is designated as 20 on one side and 22 on the other side of the hole. This electroless copper covers the entire board and will be in the order of only a few angstroms thick. This flash may, if so desired, be reinforced with electroplated strike (not shown) for durability.

Figure 7:
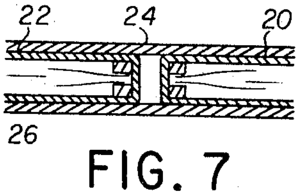
FIG. 7 illustrates the board of FIG. 6 after an application of photo resist.

In FIG. 7 a coating of photoresist is applied to the entire board including the electroless copper. This photoresist on one side of the board is designated as 24 and on the other side as 26. It will be noted that the resist is of a thickness such that it "tents" the hole.

Figure 8:
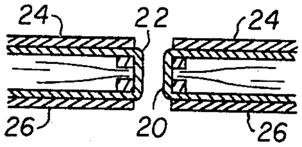

In FIG. 8 the photoresist has been exposed and the unexposed portion immediately around the hole has been removed. This leaves the hole and the electroless copper portions 20 and 22 in the hole area exposed to a normal copper plating solution.

Figure 9:
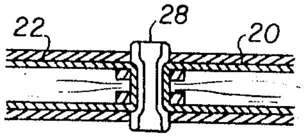
FIG. 9 illustrates the board after the application of electrodeposited material in the hole area as illustrated in FIG. 8.

In FIG. 9 an electrolytic copper plate 28 is shown attached to the electroless copper flash 20 and 22 and it extends out beyond the surface of the photoresist. However, the main object is to provide a satisfactorily thick coating of about .003 on the interior surface of the hole.

Figure 10:
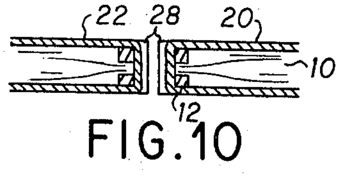
FIG. 10 illustrates the board of FIG. 9 after removal of the photo resist and a minor sanding operation to remove excess material as deposited in the hole.

In FIG. 10 the photoresist has been removed and the surface of the board has been very lightly sanded. This sanding will remove the extension or ends of the recently plated copper 28 from above the surface of the board. As will be noted, since the sanding merely removed the plated copper, the copper coating 20 and 22 applied in conjunction with FIG. 6 is still short circuiting all the rest of the circuit paths on the board.

Figure 11:
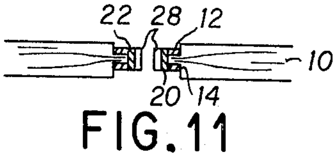
FIG. 11 illustrates the board of FIG. 10 after application of an etching solution to remove the electroless flashing and to prepare the circuit for overplating.

In FIG. 11 the copper flash 20 and 22 is etched from the surface of the board and the process and time used actually etches the copper pads on the hole and remaining conductors comprising the remaining material 12 and 14 below the surface of the board about .0002. This etching reduces the thickness of the recently plated copper 28. However, the etching is not able to get at the electroless plated copper 20 and 22 which is situated between the board 10 and the recently plated material 28.

Figure 12:
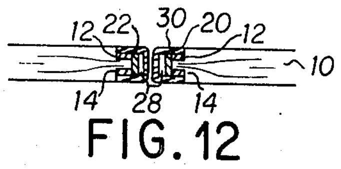
FIG. 12 illustrates the finished board with overplating applied.

In FIG. 12 it is illustrated that a final plating or overplating of an alloy comprising nickel, rhodium, and gold is used to make the hole pad and the rest of the circuitry flush with the board. The material is labeled 30. This material not only plates the surface of the paths but in addition plates the inside of the hole. Thus, the original drilling of the hole must be of such a size to allow for the addition of a layer of electroless plated copper flash, a layer of electrolytic plated copper material, and the overplating. Since the overplating is approximately .0004 inch thick and the material was etched inch below .0002 below flush, the plated through holes and the rest of the circuit paths are actually .0002 inch above the surface of the board 10. However, this complies with the requirements of the particular board. The overplating may be applied so that it is flush with the board rather than above the board if so desired. It will be noted that the overplating not only compensates for the etching to remove the electroless copper but provides a superior surface from a wear standpoint.

It should however be realized that overplating is not necessary to the inventive process and that some embodiments of boards produced in accordance with the invention will stop with the removal of the material 20 and 22 from the surface of the board in the first part of FIG. 11 leaving the copper paths flush with the surface.

Further, the process described usually referred to copper conductors as this is a common conductive material. However other conductive materials may be usable in some or all of the steps.

In summary of the above described process, it will be realized that the steps involved in producing the board are to first form a printed circuit in the normal fashion when using a flushing type material comprising subjecting the board to high pressures and temperatures after formation of the circuit paths. At this time the holes are drilled and an electroless flash is applied to produce an electric circuit from one side of the board to the other through the holes. A resist is then applied and developed to expose only the immediate vicinity of the hole area. The device is then electroplated to produce a durable plating within the hole area. Upon removal of the photoresist the board is lightly abraded to remove excess material protruding above the surface of the board in the hole areas. Finally, an etching solution is utilized to remove the flash from the surface of the board. If so desired, this etching can proceed to remove additional material from the circuit paths for the purpose of overplating.

While a process has been described, it is believed that there is invention in the printed circuit board per se since previously no printed circuit board has been produced wherein the circuit paths are flush with the surface of the board and wherein the material between the circuit paths comprising epoxy impregnated glass fiber material and still has plated through holes.

It is, therefore, my belief that I have an invention both in the process and the product and I wish to be limited not by the scope of the process as shown in the drawings and the specific embodiment described but only by the scope of the claims as appended wherein I claim:

1. The process of producing plated through holes in a flush surface printed circuit board having conductive paths thereon comprising the steps of:

applying an electroless plated flash to the entire board including the openings defining the holes;

applying and developing a resist material on the board wherein the area in the immediate vicinity of the holes is left unprotected;

electroplating conductive material to the electroless flash material for plating the surface of the openings;

removing the photoresist and any extensions of the electroplated material from the surface of the board;

removing the exposed electroless flash material whereby the surface of the board and the conductive paths remain substantially flush;

removing conductive material from the paths and holes of the plated circuit board to a depth below the surface of the board; and overplating the conductive material.

2. A printed circuit board produced in accordance with the steps of:

applying and developing a resist material to a double cladded copper flushing type printed circuit board wherein the developed resist material defines conductive paths and patterns on the cladded surfaces;

etching the cladded material to leave only the conductive patterns and paths;

removing the resist material;

applying pressure to recess the conductive paths and patterns flush with the surface openings of the board;

applying heat to cure the base material;

removing material from the board to define openings extending from conductive material on one surface of the board to conductive material on the other surface of the board;

attaching a conductive flashing to the board;

applying and developing a resist material to define the areas of the openings in the board wherein it is desired that there be permanent conductive paths from one side of the board to the other;

electrically applying further conductive copper material, in the area of the opening, on the exposed flash;

removing the remaining resist material;

removing the flashing exposed by the removal of the last mentioned resist material;

the board being further processed by etching the circuit paths after the removal of the last mentioned resist material below the surface of the board; and attaching an overplating to all exposed copper paths and patterns.

* * * * *